United States Patent
Chai et al.

(10) Patent No.: US 10,126,350 B2
(45) Date of Patent: Nov. 13, 2018

(54) DETECTION OF DAMPER RESISTOR DEGRADATION AND FAILURES

(71) Applicant: Hamilton Sundstrand Corporation, Charlotte, NC (US)

(72) Inventors: Huazhen Chai, Caledonia, IL (US); Dwight D. Schmitt, Rockford, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 108 days.

(21) Appl. No.: 15/271,394

(22) Filed: Sep. 21, 2016

(65) Prior Publication Data
US 2018/0080972 A1    Mar. 22, 2018

(51) Int. Cl.
| G01R 31/14 | (2006.01) |
| G01R 31/02 | (2006.01) |
| G01R 31/00 | (2006.01) |
| G01R 31/28 | (2006.01) |
| G01R 27/16 | (2006.01) |

(52) U.S. Cl.
CPC .......... *G01R 31/14* (2013.01); *G01R 31/003* (2013.01); *G01R 31/02* (2013.01); *G01R 31/2849* (2013.01); *G01R 27/16* (2013.01)

(58) Field of Classification Search
CPC .................. G01R 31/14; G01R 31/02
See application file for complete search history.

(56) References Cited

U.S. PATENT DOCUMENTS

| 3,643,156 A | * | 2/1972 | Stewart ............... G01R 27/32 324/603 |
| 5,266,901 A | * | 11/1993 | Woo .................. G01R 31/2805 324/519 |
| 5,910,889 A | | 6/1999 | Larson et al. |
| 6,145,107 A | | 11/2000 | Farokhzad |
| 2013/0169308 A1 | * | 7/2013 | Ouyang ................. H01L 22/34 324/762.03 |
| 2014/0208950 A1 | | 7/2014 | Giurgiutiu et al. |
| 2015/0145523 A1 | * | 5/2015 | Harada .................. G01R 31/42 324/538 |

(Continued)

FOREIGN PATENT DOCUMENTS

| CN | 200972498 Y | 11/2007 |
| CN | 201897717 U | 7/2011 |
| CN | 202433517 U | 9/2012 |

(Continued)

OTHER PUBLICATIONS

European Search Report for Application No. 17192298.2, dated Feb. 27, 2018, 7 Pages.

Primary Examiner — Walter L Lindsay, Jr.
Assistant Examiner — Milton Gonzalez
(74) Attorney, Agent, or Firm — Cantor Colburn LLP

(57) ABSTRACT

A system and method of detecting dampener resistor degradation and failure are provided. The method includes determining a normal operating admittance value of a filter that includes a dampener resistor, injecting a voltage signal with a frequency value at least one order of magnitude different from a filter resonant peak, receiving an admittance output in response the injected voltage signal, and comparing the admittance output with the normal operating admittance value to determine the presence of dampener resistor degradation and failure.

20 Claims, 19 Drawing Sheets

(56) References Cited

U.S. PATENT DOCUMENTS

2016/0146676 A1  5/2016  Ukegawa et al.

FOREIGN PATENT DOCUMENTS

| CN | 203502518 U | 3/2014 |
|---|---|---|
| CN | 102570464 B | 4/2014 |
| CN | 102593848 B | 8/2014 |
| CN | 203870168 U | 10/2014 |
| CN | 104198831 A | 12/2014 |
| CN | 105140922 A | 12/2015 |
| CN | 105633965 A | 6/2016 |
| TW | I450488 B | 8/2014 |

* cited by examiner

Fig. 10 Admittance vs frequency curve for a typical power filter with damper resistance value doubled (degraded resistor).

Fig. 11 Admittance vs frequency curve for a typical power filter with an open circuit (failed) damper resistor.

Fig. 12 Admittance vs frequency curve for a typical power filter with a shorted (failed) damper resistor.

Fig. 13 Admittance between A and B phases when one damper resistance decreases and another damper resistance increases by the same amount.

Fig. 14 Admittance between B and C when one damper resistance decreases and another damper resistance increases by the same amount.

Fig. 15 Admittance between C and A when one damper resistance decreases and another damper resistance increases by the same amount.

Fig. 18 Admittance vs frequency curve of Fig.4 topology power filter with normal damper.

Fig. 19 Admittance vs frequency curve of Fig. 4 topology power filter with damper resistance value doubled (degraded resistor).

Fig. 20 Admittance vs frequency curve of Fig. 4 topology power filter with an open circuit (failed) damper resistor.

Fig. 21 Admittance vs frequency curve of Fig 4 topology power filter with a shorted (failed) damper resistor.

DETECTION OF DAMPER RESISTOR DEGRADATION AND FAILURES

BACKGROUND

Exemplary embodiments pertain to the art of detecting damper resistor degradation and/or failures.

Power filters can be used on, for example, motor controllers and power converters to reduce current and voltage harmonics as well as for electromagnetic compatibility (EMC) compliance. A basic building block of a power filter is a low pass filter comprised of an inductor L and a capacitor C. This filter typically also contains a damper circuit comprised of a capacitor and a damper resistor R.

Damper resistors are used for helping meet harmonic current draw requirements from standard AC busses. However, degradation or loss of a damper resistor can result in degradation of system performance in the form of increased dissipation losses input feeders. Additionally, the degradation or loss of a damper resistor can increase voltage stresses in other users of a standard bus that is affected by the damper resistor. Further, the failure or degradation of damper resistors can result in a latent failure that is not detectable by most testing at the product level or by Line-replaceable unit (LRU) sense protection functions while it is operating in the field.

Accordingly, there is a desire to provide a system and/or method for detecting degradation and/or loss of a damper resistor.

BRIEF DESCRIPTION

According to one embodiment a method of detecting dampener resistor degradation and failure is provided. The method includes determining a normal operating admittance value of a filter that includes a dampener resistor, injecting a voltage signal with a frequency value at least one order of magnitude different from a filter resonant peak, receiving an admittance output in response the injected voltage signal, and comparing the admittance output with the normal operating admittance value to determine the presence of dampener resistor degradation and failure.

In addition to one or more of the features described above, or as an alternative, further embodiments may include injecting the voltage signal with the frequency value at least one order of magnitude different from a filter resonant peak further includes injecting the voltage signal with a frequency value at least one order of magnitude higher than the filter resonant peak.

In addition to one or more of the features described above, or as an alternative, further embodiments may include injecting the voltage signal with the frequency value at least one order of magnitude different from a filter resonant peak further includes injecting a voltage signal with a frequency value at least one order of magnitude lower than the filter resonant peak.

In addition to one or more of the features described above, or as an alternative, further embodiments may include measuring the admittance of the filter at the frequency higher than or lower than the resonant peak of filter.

In addition to one or more of the features described above, or as an alternative, further embodiments may include measuring an impedance of the filter at the frequency higher than or lower than the resonant peak of filter.

In addition to one or more of the features described above, or as an alternative, further embodiments may include measuring a conductance of the filter at the frequency higher than or lower than the resonant peak of the filter.

In addition to one or more of the features described above, or as an alternative, further embodiments may include measuring a resistance of the filter at the frequency higher than or lower than the resonant peak of the filter.

In addition to one or more of the features described above, or as an alternative, further embodiments may include diagnosing damper conditions based on one or more of a resistance, an impedance, an admittance, and a conductance measurement of the dampener resistor.

In addition to one or more of the features described above, or as an alternative, further embodiments may include diagnosing damper conditions further including extracting harmonic signals of frequency higher than or lower than the resonant peak from power supply voltages and currents.

In addition to one or more of the features described above, or as an alternative, further embodiments may include adapting the method into at least one of a test procedure and a test specification.

In addition to one or more of the features described above, or as an alternative, further embodiments may include adapting the testing method into a built-in-test code for a product.

According to one embodiment a system for detecting dampener resistor degradation and failure is provided. The system includes a memory having computer readable instructions, and a processor configured to execute the computer readable instructions, the computer readable instructions including determining a normal operating admittance value of a filter that includes a dampener resistor, injecting a voltage signal with a frequency value at least one order of magnitude different from a filter resonant peak, receiving an admittance output in response the injected voltage signal, and comparing the admittance output with the normal operating admittance value to determine the presence of dampener resistor degradation and failure.

In addition to one or more of the features described above, or as an alternative, further embodiments may include additional computer readable instructions, the computer readable instructions including injecting the voltage signal with a frequency value at least one order of magnitude higher than the filter resonant peak.

In addition to one or more of the features described above, or as an alternative, further embodiments may include additional computer readable instructions, the computer readable instructions including injecting a voltage signal with a frequency value at least one order of magnitude lower than the filter resonant peak.

In addition to one or more of the features described above, or as an alternative, further embodiments may include additional computer readable instructions, the computer readable instructions including measuring the admittance of the filter at the frequency higher than or lower than the resonant peak of filter.

In addition to one or more of the features described above, or as an alternative, further embodiments may include additional computer readable instructions, the computer readable instructions including measuring an impedance of the filter at the frequency higher than or lower than the resonant peak of filter.

In addition to one or more of the features described above, or as an alternative, further embodiments may include additional computer readable instructions, the computer readable instructions including measuring a conductance of the filter at the frequency higher than or lower than the resonant peak of the filter.

In addition to one or more of the features described above, or as an alternative, further embodiments may include additional computer readable instructions, the computer readable instructions including measuring a resistance of the filter at the frequency higher than or lower than the resonant peak of the filter.

In addition to one or more of the features described above, or as an alternative, further embodiments may include additional computer readable instructions, the computer readable instructions including diagnosing damper conditions based on one or more of a resistance, impedance, admittance, and a conductance measurement of the dampener resistor.

According to one embodiment a computer program product for detecting dampener resistor degradation and failure, the computer program product including a computer readable storage medium having program instructions embodied therewith, the program instructions executable by a processor to cause the processor to determine a normal operating admittance value of a filter that includes a dampener resistor, inject a voltage signal with a frequency value at least one order of magnitude different from a filter resonant peak, receive an admittance output in response the injected voltage signal, and compare the admittance output with the normal operating admittance value to determine the presence of dampener resistor degradation and failure.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Figure 2:
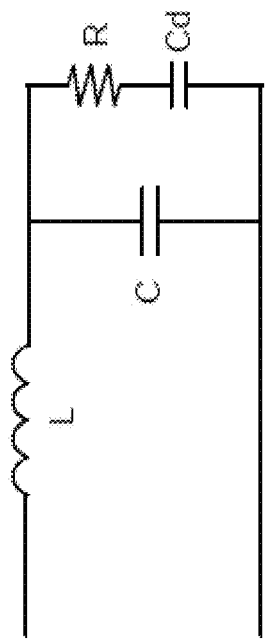
FIG. 2 depicts a filter topology with capacitive damper connected across the filter capacitor for practice of the teachings herein in accordance with one or more embodiments.

A detailed description of one or more embodiments of the disclosed apparatus and method are presented herein by way of exemplification and not limitation with reference to the Figures.

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Embodiments described herein are directed to a testing method that can detect the degradation and/or failure of a damper resistor in, for example, a motor controller.

According to one or more embodiments, the method can detect degradation of the damper resistor while only needing to access the input power terminals outside the product enclosure. For example, in accordance with one or more embodiments, a testing method is used to diagnose the conditions of the damper resistors specifically at the LRU level that only needs access to the input power terminals or connectors. According to other embodiments, additional access points can also be provided. Further according to other embodiments, the testing method can be incorporated into product level testing, such as for example product power up checking, a motor controller testing, and/or power converter that utilizes a power filter testing.

Figure 1:
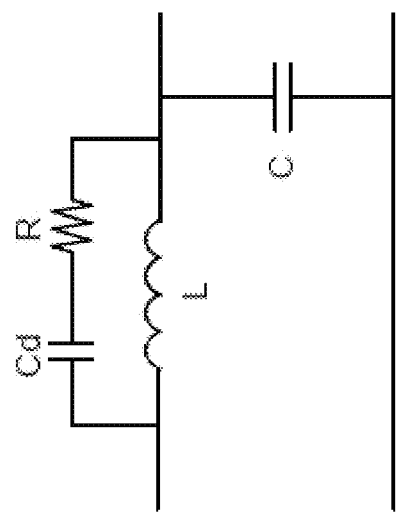
FIG. 1 depicts a filter topology with capacitive damper connected across the filter inductor for practice of the teachings herein in accordance with one or more embodiments.

According to one or more embodiments, a damper can use a resistor and capacitor in series to form the damper. The damper is either connected across the filter inductor or across the filter capacitor as shown in FIG. 1 or FIG. 2. According to other embodiments, dampers can use resistor and inductor in series or resistor alone as shown in FIGS. 3, 4, 5 and 6). Specifically, EMI filters and harmonic filters topologies per phase are shown in FIG. 1 through FIG. 6. They differ from each other in the type of damper circuits and locations of the damper circuits.

For example, turning now to FIG. 1, a filter topology with capacitive damper connected across the filter inductor for practice of the teachings herein is shown in accordance with one or more embodiments. Specifically, the filter has an inductor L that is connected in series with a capacitor C. Additionally, the filter includes a damper resistor that includes a resistor R and a dampening capacitor Cd connected in series. The damper resistor is connected in parallel across the inductor L.

FIG. 2 depicts a filter topology with capacitive damper connected across the filter capacitor for practice of the teachings herein in accordance with one or more embodiments. Specifically, the filter has an inductor L that is connected in series with a capacitor C. Additionally, the filter includes a damper resistor that includes a resistor R and a dampening capacitor Cd connected in series. The damper resistor is connected in parallel across the capacitor C.

Figure 3:
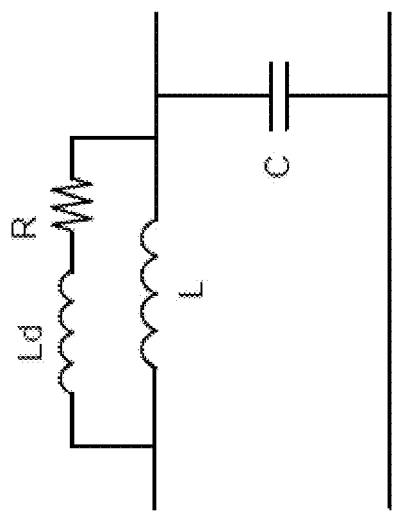
FIG. 3 depicts a filter topology with inductive damper connected across the filter inductor for practice of the teachings herein in accordance with one or more embodiments.

FIG. 3 depicts a filter topology with inductive damper connected across the filter inductor for practice of the teachings herein in accordance with one or more embodiments. Specifically, the filter has an inductor L that is connected in series with a capacitor C. Additionally, the filter includes a damper resistor that includes a resistor R and a dampening inductor Ld connected in series. The damper resistor is connected in parallel across the inductor L.

Figure 4:
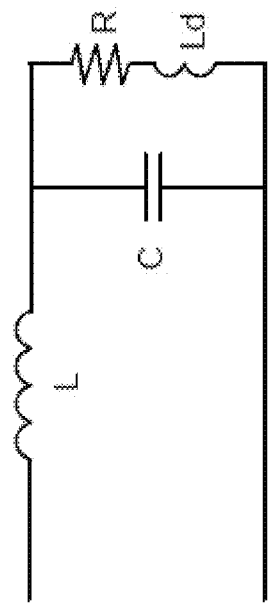
FIG. 4 depicts a filter topology with inductive damper connected across the filter capacitor for practice of the teachings herein in accordance with one or more embodiments.

FIG. 4 depicts a filter topology with inductive damper connected across the filter capacitor for practice of the teachings herein in accordance with one or more embodiments. Specifically, the filter has an inductor L that is connected in series with a capacitor C. Additionally, the filter includes a damper resistor that includes a resistor R and a dampening inductor Ld connected in series. The damper resistor is connected in parallel across the capacitor C.

Figure 5:
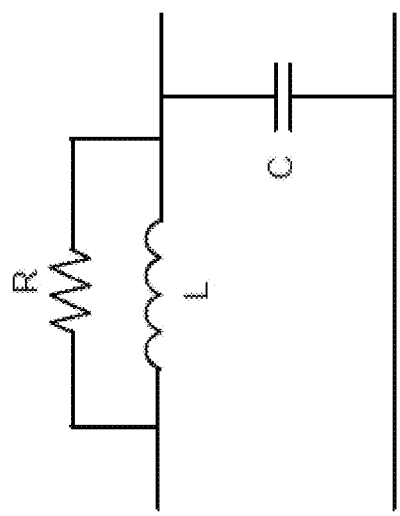
FIG. 5 depicts a simplified filter topology with damper resistor connected across the filter inductor for practice of the teachings herein in accordance with one or more embodiments.

FIG. 5 depicts a simplified filter topology with damper resistor connected across the filter inductor for practice of the teachings herein in accordance with one or more embodiments. Specifically, the filter has an inductor L that is connected in series with a capacitor C. Additionally, the filter includes a damper resistor that includes only a resistor R. The damper resistor is connected in parallel across the inductor L.

Figure 6:
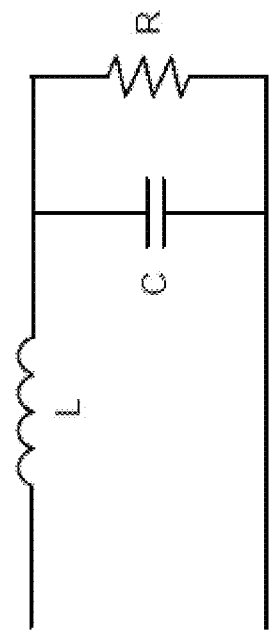
FIG. 6 depicts a simplified filter topology with damper resistor connected across the filter capacitor for practice of the teachings herein in accordance with one or more embodiments.

FIG. 6 depicts a simplified filter topology with damper resistor connected across the filter capacitor for practice of the teachings herein in accordance with one or more embodiments. Specifically, the filter has an inductor L that is connected in series with a capacitor C. Additionally, the filter includes a damper resistor that includes only a resistor R. The damper resistor is connected in parallel across the capacitor C.

In accordance with one or more embodiments, the damper resistor R can be damaged or degraded. This can occur by, for example, an inrush of energy incurred during power up and other transients. The damage or degradation can also occur creating a failure of the damper resistor due to the weakness of a package and internal construction of the package of resistors. Other environmental conditions could also cause damage or degradation of the damper resistor. Further, in many cases, a degraded or failed damper resistor would not affect the operation of a motor controller, and therefore the damper failure can be and remain latent and go undetected.

Accordingly, one or more embodiments include injecting a voltage or current signal with a frequency beyond a resonant peak of the filter. By injecting a voltage or current signal of a frequency beyond the resonant peak of the filter, the response current or voltage is most directly related to the damper resistance value, and least affected by the effects of the inductive and capacitive components tolerances. This results in a reliable testing with high sensitivity to damper resistance change, an indication of component degradation.

Figure 7:
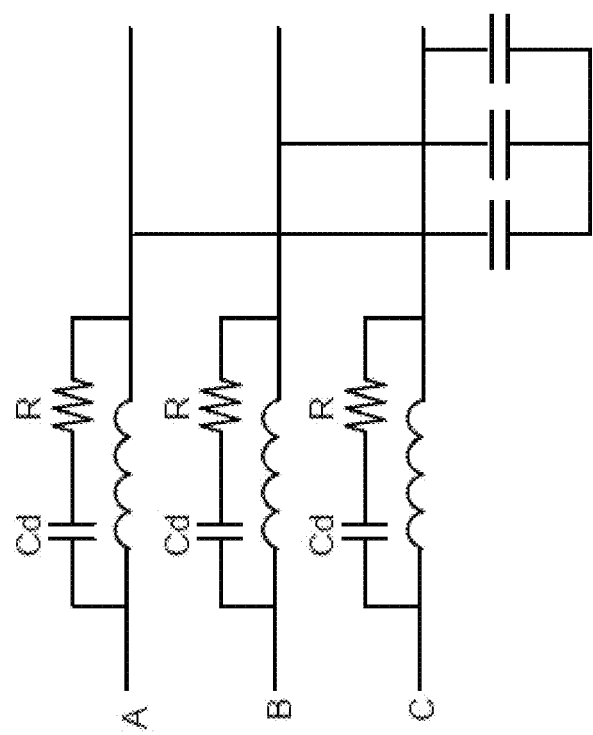
FIG. 7 depicts an example of one possible three phase implementations using the topology of FIG. 1 for practice of the teachings herein in accordance with one or more embodiments.
Figure 8:
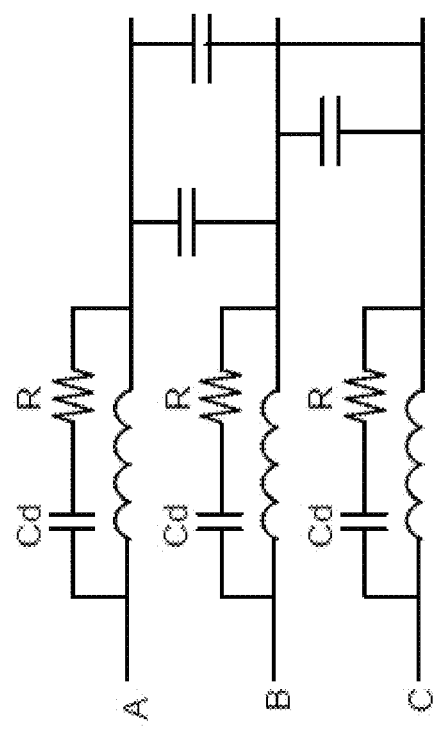
FIG. 8 depicts an example of another possible three phase implementations using the topology of FIG. 1 for practice of the teachings herein in accordance with one or more embodiments.

FIG. 7 and FIG. 8 are examples of two possible three phase implementations of FIG. 1 topology in accordance with one or more embodiments. Specifically, FIG. 7 depicts an example of one possible three phase implementations using the topology of FIG. 1 for practice of the teachings herein in accordance with one or more embodiments. As shown, FIG. 7 includes three filters (A, B, and C) connected in parallel with the corresponding capacitors being connected to a common connection point.

FIG. 8 depicts an example of another possible three phase implementations using the topology of FIG. 1 for practice of the teachings herein in accordance with one or more embodiments. Specifically, FIG. 8 includes three filters (A, B, and C) that are also connected in parallel. However, the capacitors are connected such that the capacitor for filter A connects to filter B, the capacitor for filter B connects to filter C, and the capacitor for filter C connected to filter A as shown.

According to other embodiments, other circuit arrangements can be provided that as the above embodiments are not an exhaustive listing but are meant to show the variety of filter arrangements than can be used with the detection method as described herein.

Figure 9:
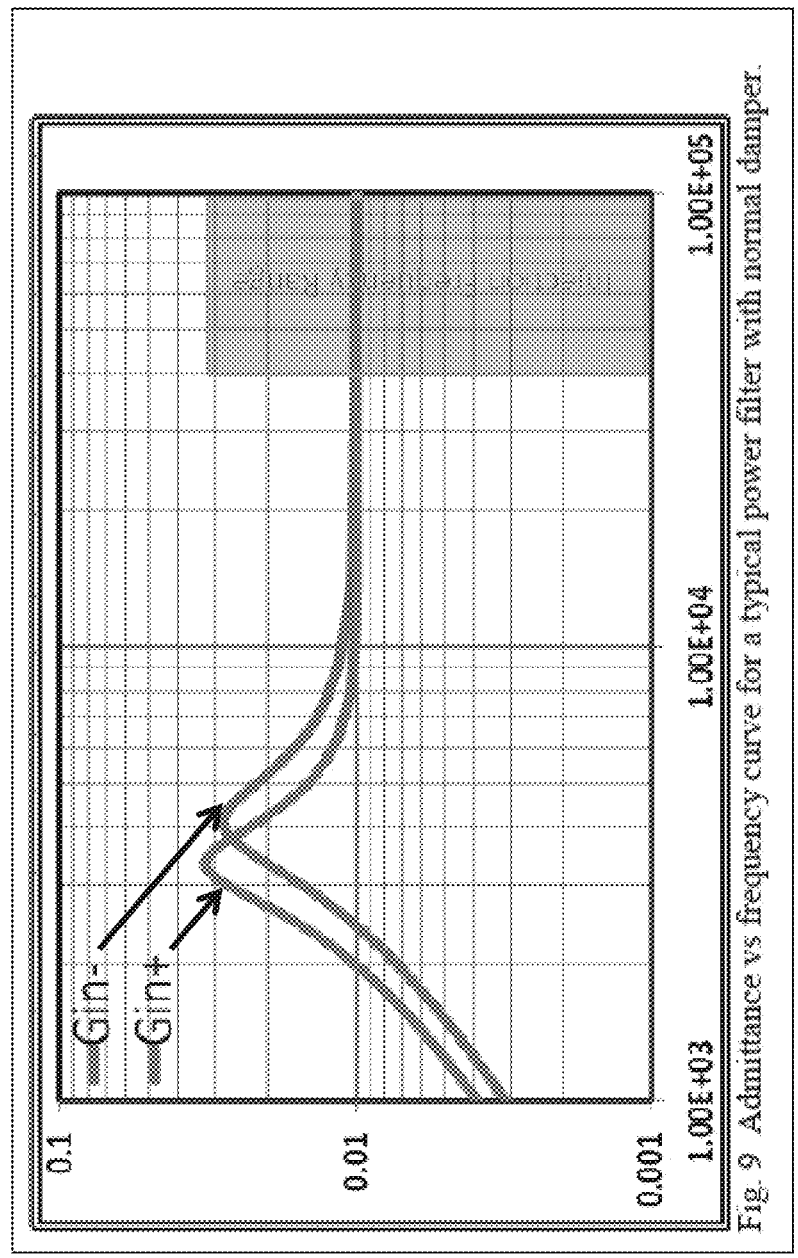
FIG. 9 depicts admittance vs frequency curve for a power filter with a normal damper in accordance with one or more embodiments.

In accordance with one or more embodiments, the input admittance between two phase lines of the input terminals varies with frequencies. For example, a typical admittance vs frequency plot for a low pass power filter with a damper working normally is shown in FIG. 9. As shown, the two curves show the two extreme conditions where the filter component tolerances took the two extremes (+/−10% for example). Any testing based on a signal frequency of near or lower than 10 kHz would be greatly influenced by the filter inductances, capacitance, and the component tolerances. Thus the variation of damper resistance would be buried and overwhelmed by parameters that are not related to the damper resistor condition.

Figure 10:
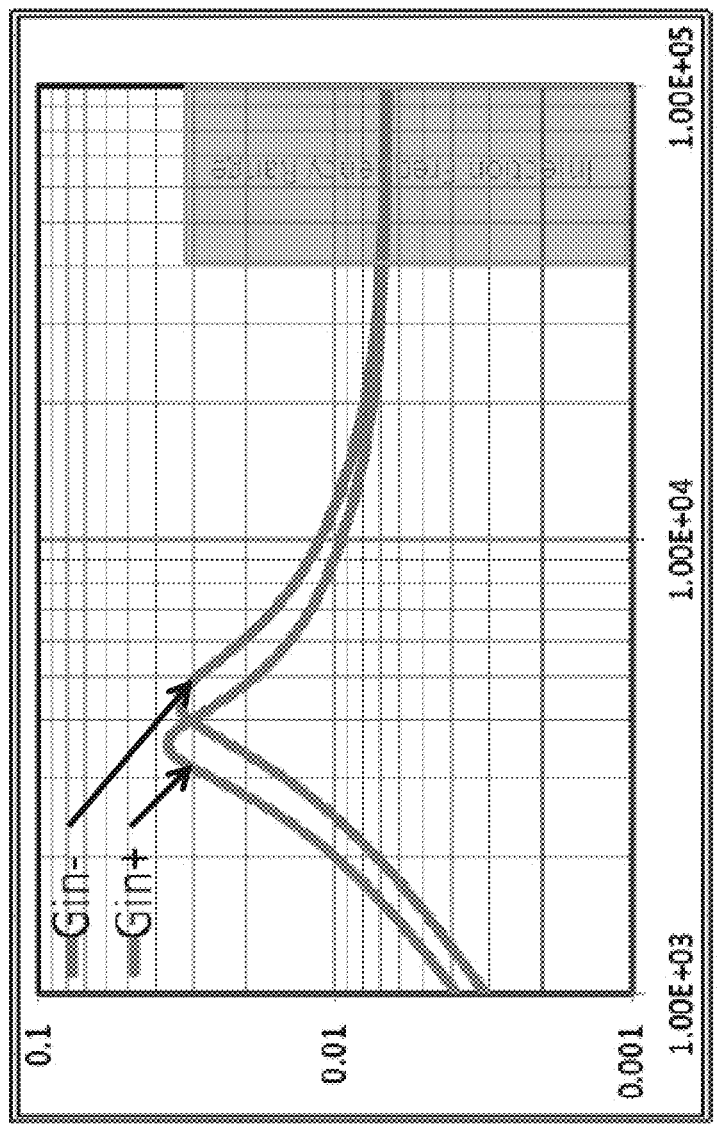
FIG. 10 depicts admittance vs frequency curve for a power filter with damper resistance value doubled (degraded resistor) in accordance with one or more embodiments.

Further, in accordance with one or more embodiments, FIG. 10 shows the admittance curve when a damper resistance values have doubled which indicates that a severely degraded damper resistor is present. As shown, in this condition even as the frequency is increased the output admittance remains below the 0.01 normal resting value as shown in FIG. 9. Specifically, if a testing signal is chosen well above the resonant frequency of the L-C filter, in the frequency range between 40 kHz and 1 MHz (as indicated in the shaded area) for a L-C resonance of 4-10 kHz, the admittance is almost exactly reversely proportional to the Damper resistance. Accordingly, degradation of the damper resistor can be detected and approximated based on this admittance reading.

Figure 11:
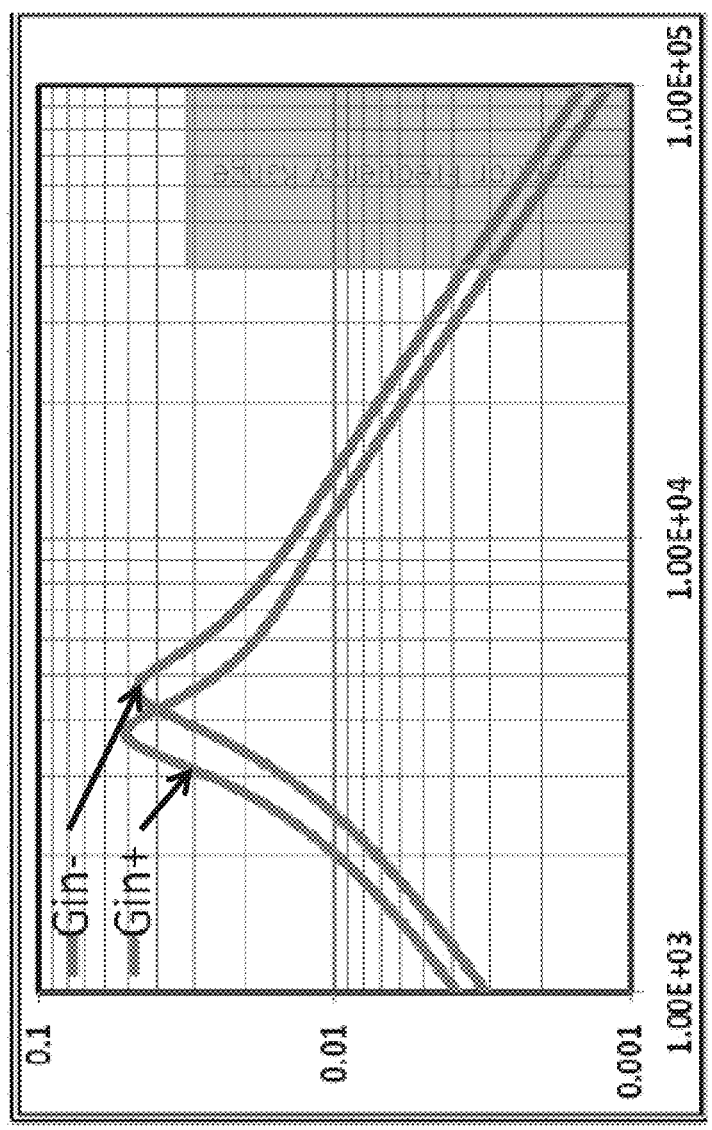
FIG. 11 depicts admittance vs frequency curve for a power filter with an open circuit (failed) damper resistor in accordance with one or more embodiments.
Figure 12:
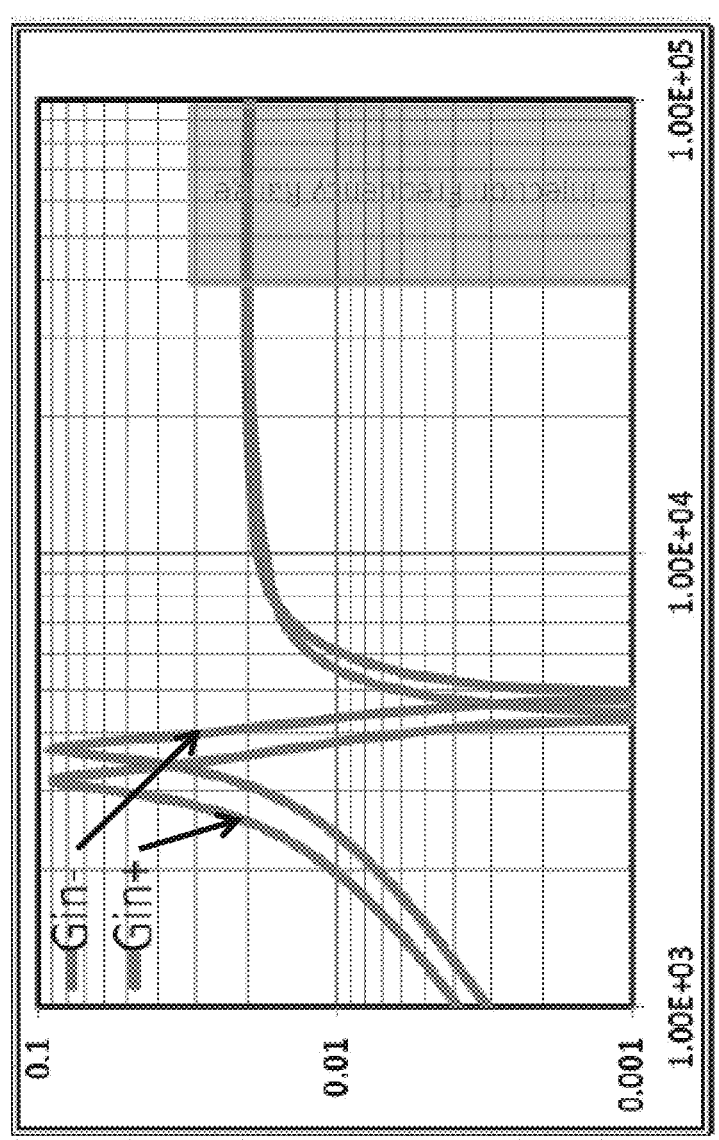
FIG. 12 depicts admittance vs frequency curve for a power filter with a shorted (failed) damper resistor in accordance with one or more embodiments.

Further, in accordance with one or more embodiments, FIGS. 11 and 12 show admittance curves when one of the damper resistor value becomes open circuit (FIG. 11) and short circuit (FIG. 12) respectively. These are the cases of a completely failed damper resistor being present. As shown, there is a clear correlation between the admittance measurements and the value of the damper resistance. Specifically, in the injection frequency range the admittance values are well below or above the 0.01 normal value which can be used to detect the failure of the damper resistor.

Further, in accordance with one or more embodiments, there are many instances where the input filters are three-phase and the filters are line to line, for example, as shown in FIG. 8. In this embodiment as shown, the filter response is now dependent on at least two resistors. In one or more embodiments, the one resistor may be good and the other degraded or failed. The detection of a single damper resistor failure can be detected using a similar approach by selecting a voltage or current in the injection frequency range, but may have somewhat reduced sensitivity to resistance change due to paralleling effects.

Figure 13:
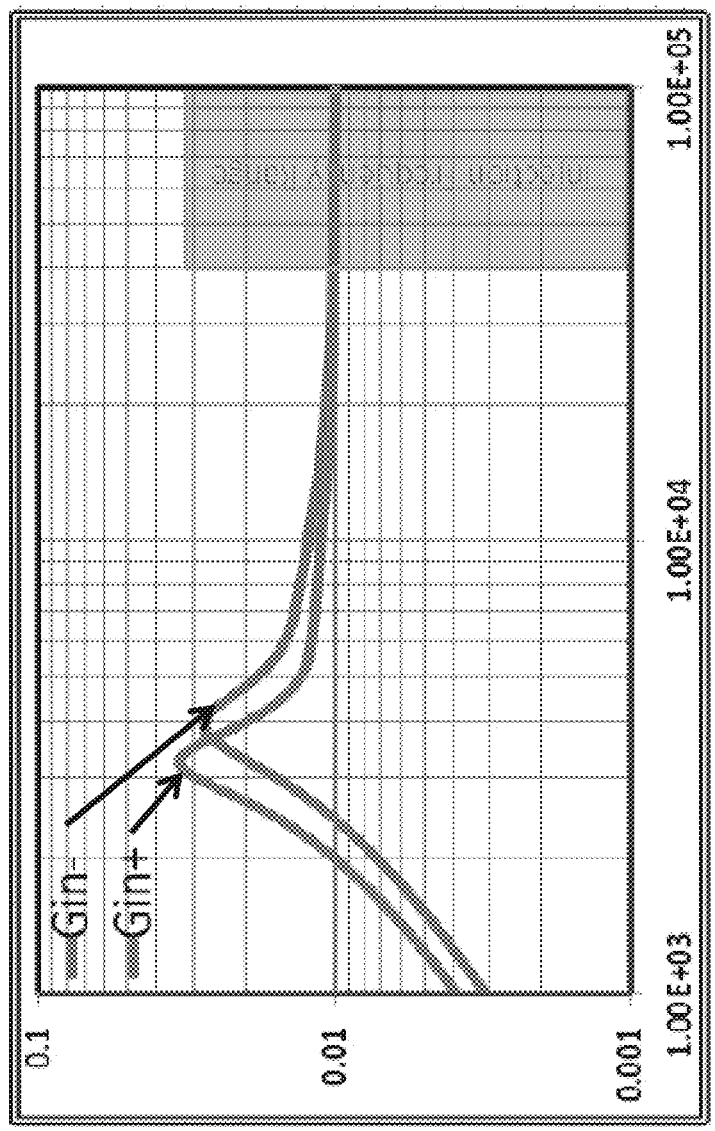
FIG. 13 depicts admittance between A and B phases when one damper resistance decreases and another damper resistance increases by the same amount in accordance with one or more embodiments.

Further, according to one or more embodiments, a measurement can be between two phase lines, so the admittance measured is the sum of the two damper resistors in the two phases involved. For example, FIG. 13 shows that if damper resistance in one phase decreases and in the second phase increases by the same amount, the measured admittance would remain unchanged, not detecting the damper degradation.

Therefore, in accordance with one or more embodiments, the testing for a three phase filter network is conducted across each combination of two phases, A-B, B-C, C-A, three times to diagnose the conditions of all three damper resistors. So in the rare cases where damper resistance decrease in one phase were compensated by the damper resistance increase in another phase, FIG. 13, it would be detected by the testing on other combination of phases, as shown in FIG. 14 and FIG. 15.

Figure 14:
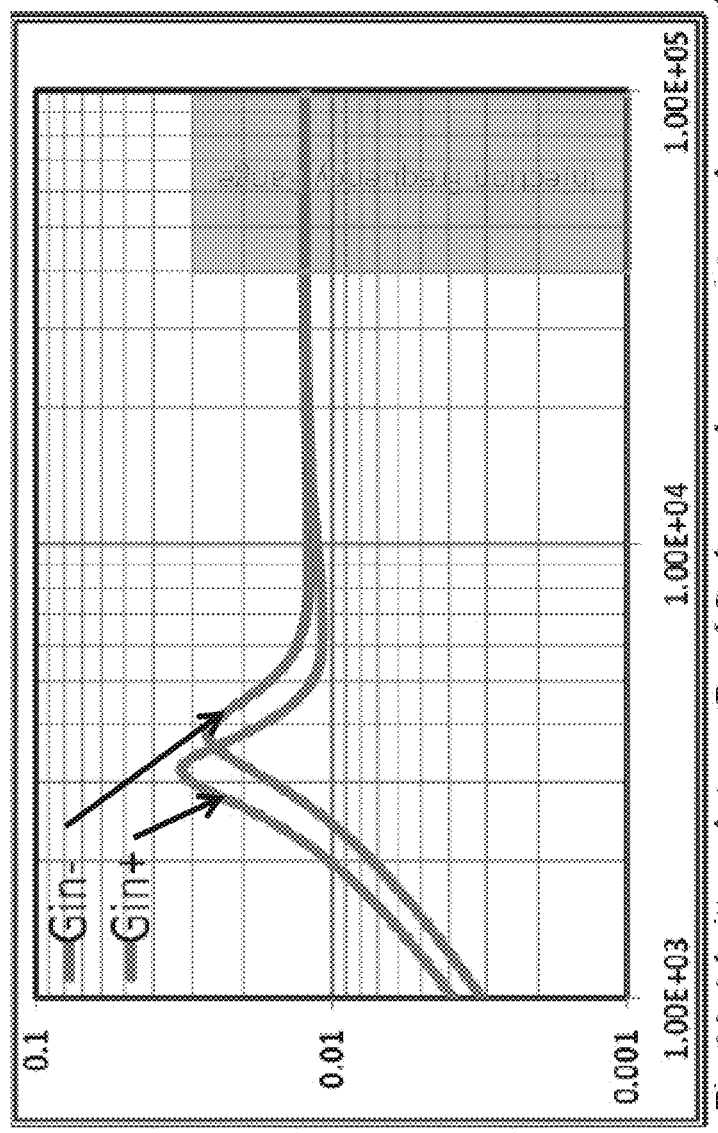
FIG. 14 depicts admittance between B and C when one damper resistance decreases and another damper resistance increases by the same amount in accordance with one or more embodiments.
Figure 15:
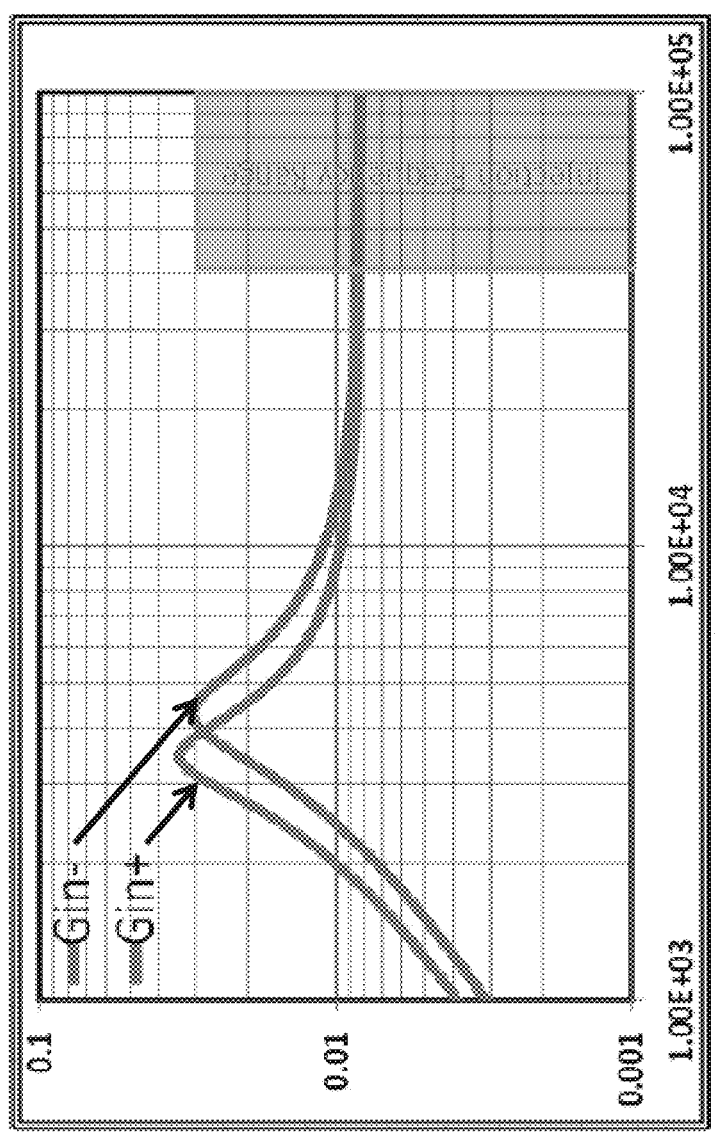
FIG. 15 depicts admittance between C and A when one damper resistance decreases and another damper resistance increases by the same amount in accordance with one or more embodiments.

Specifically, FIG. 14 shows the admittance between B and C when one damper resistance decreases and another damper resistance increases by the same amount. As shown, when the values are selected in the injection frequency range admittance is detected that is above the normal 0.01 value. Further, FIG. 15 shows the admittance between C and A when one damper resistance decreases and another damper resistance increases by the same amount. As shown, when the values are selected in the injection frequency range admittance is detected that is below the normal 0.01 value. Therefore, even if the degradation or failure is not detected between A and B, further measurements on B and C and A and C will provide the ability to detect the degradation or failure.

Figure 16:
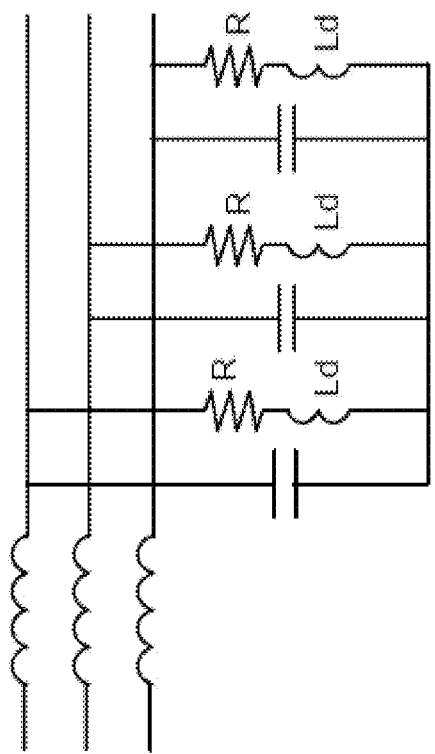
FIG. 16 depicts an example of one possible three phase implementations using FIG. 4 topology for practice of the teachings herein in accordance with one or more embodiments.
Figure 17:
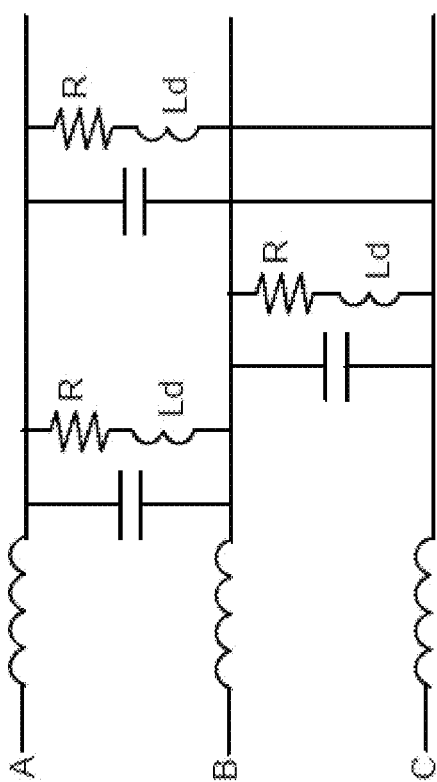
FIG. 17 depicts an example of another possible three phase implementations using FIG. 4 topology for practice of the teachings herein in accordance with one or more embodiments.
Figure 18:
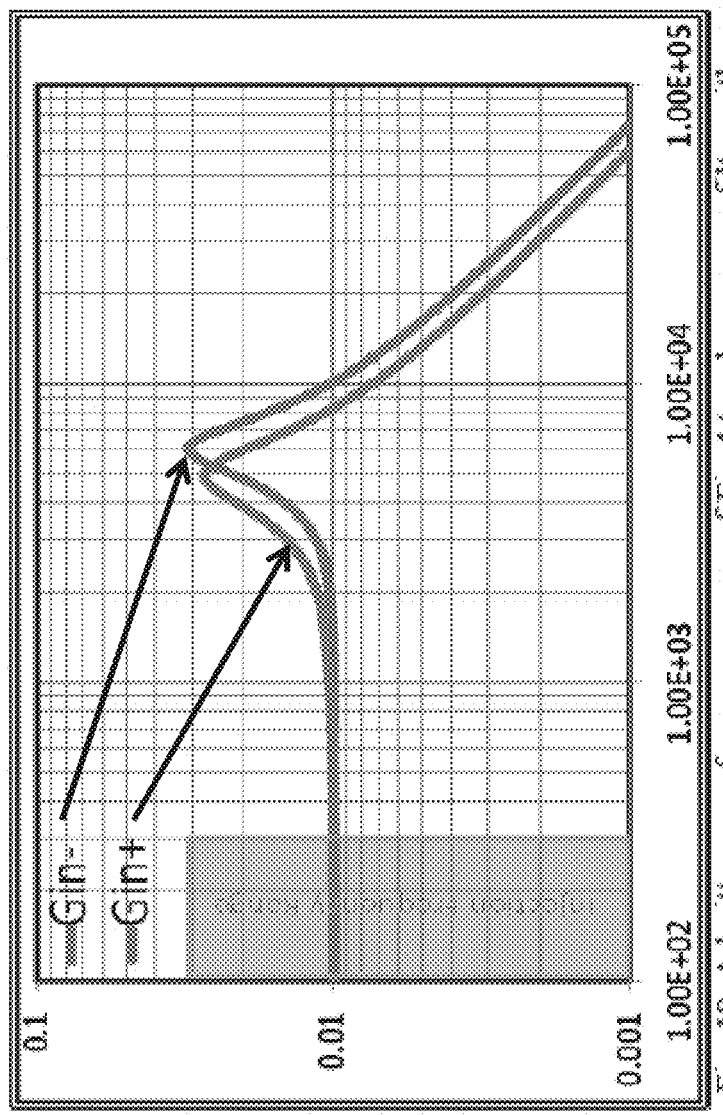
FIG. 18 depicts admittance vs frequency curve using the FIG. 4 topology power filter with normal damper in accordance with one or more embodiments.

Similarly, FIG. 16 and FIG. 17 are two possible three phase implementations of FIG. 4 topology in accordance with one or more embodiments. For this topology, the damper resistance value is detected by using low frequency testing signals. For example, if a voltage signal of lower than 300 Hz (marked by shaded area), the admittance or conductance viewed from input terminals would be directly related to the damper resistance value. FIG. 18, 19, 20, 21 illustrate the input admittance curve with damper resistance of normal value, value doubled (degraded), open and short (failed) respectively.

Specifically, FIG. 18 depicts admittance vs frequency curve using the FIG. 4 topology power filter with normal damper in accordance with one or more embodiments. As shown in the low frequency, injection frequency range, selected the admittance value is right at 0.01 for this normally functioning damper resistor.

Figure 19:
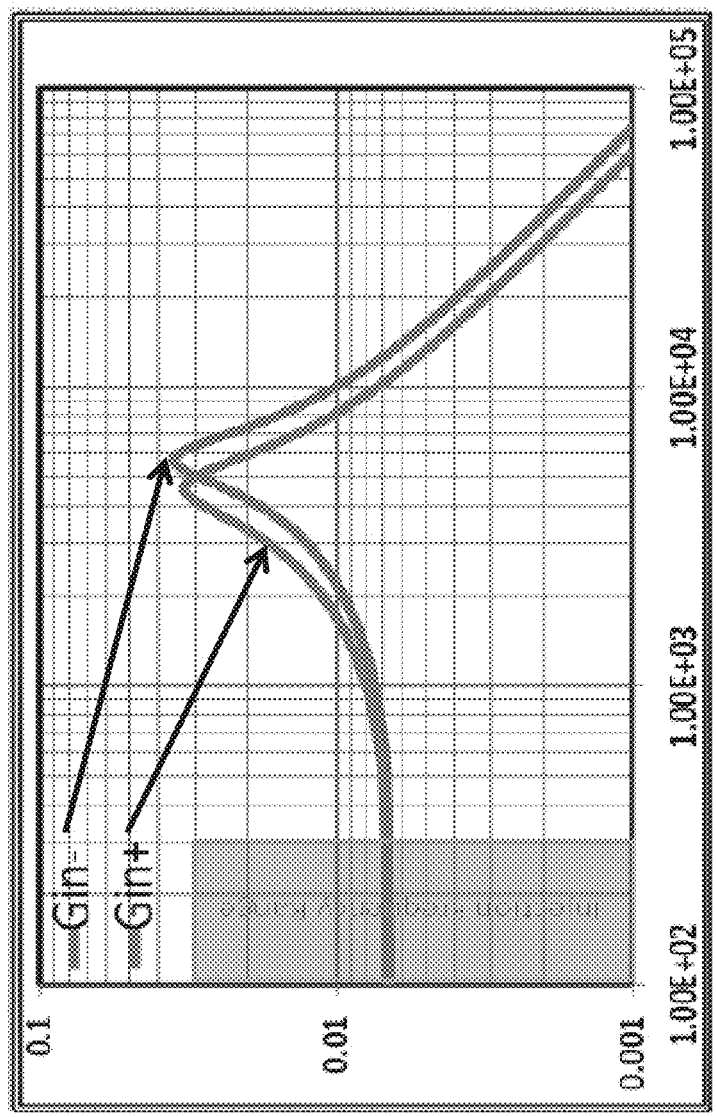
FIG. 19 depicts admittance vs frequency curve using the FIG. 4 topology power filter with damper resistance value doubled indicating a degraded resistor in accordance with one or more embodiments.

FIG. 19 depicts admittance vs frequency curve using the FIG. 4 topology power filter with damper resistance value doubled indicating a degraded resistor in accordance with one or more embodiments. As shown, the admittance in the injection frequency range is shown below the normal center value.

Figure 20:
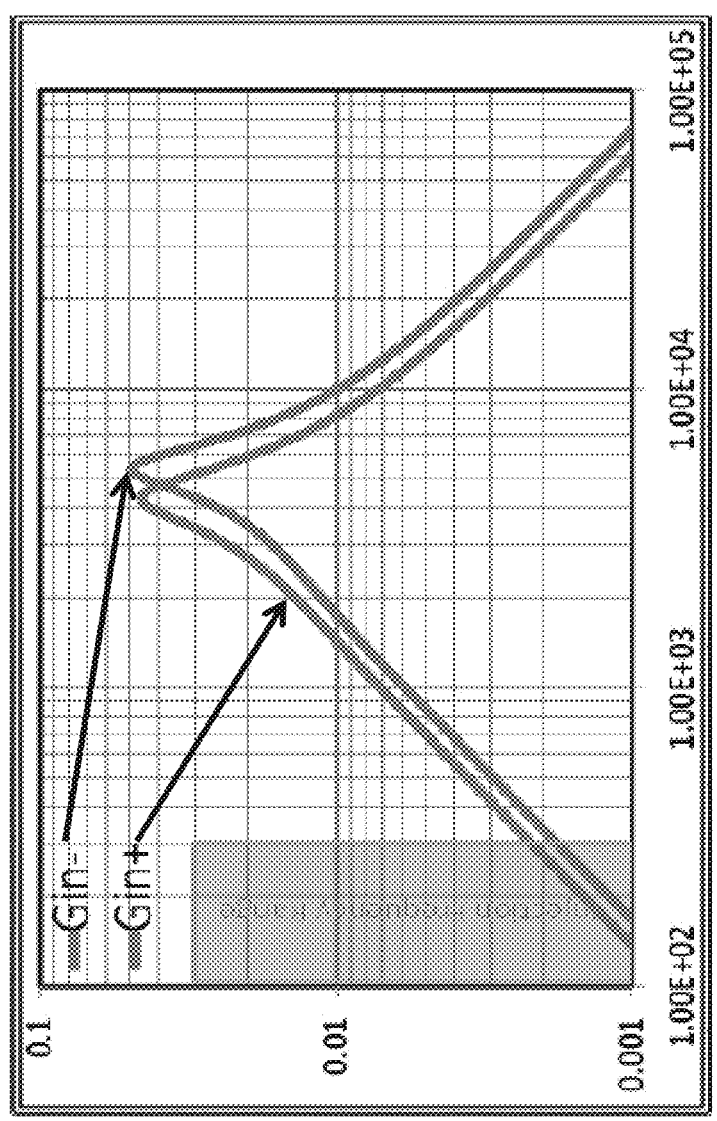
FIG. 20 depicts admittance vs frequency curve using the FIG. 4 topology power filter with an open circuit which indicates a failed damper resistor in accordance with one or more embodiments.

FIG. 20 depicts admittance vs frequency curve using the FIG. 4 topology power filter with an open circuit which indicates a failed damper resistor in accordance with one or more embodiments. As shown, the admittance value in the injection frequency range is well below the normal operating value.

Figure 21:
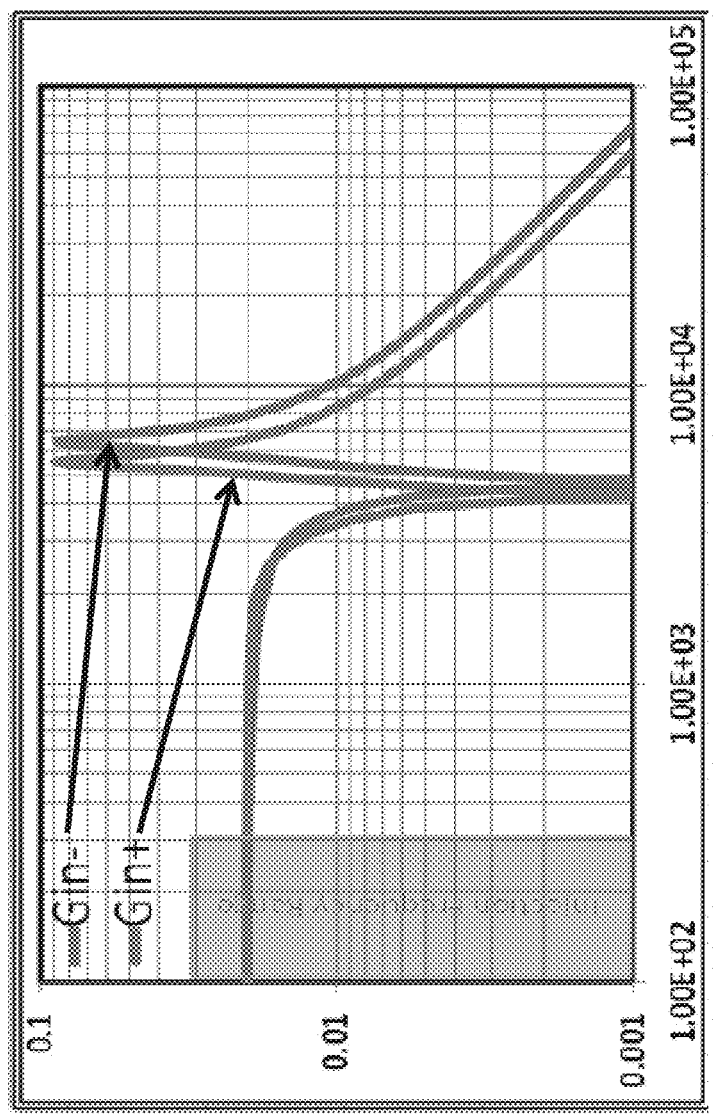
FIG. 21 depicts admittance vs frequency curve using the FIG. 4 topology power filter with a shorted failed damper resistor in accordance with one or more embodiments.

FIG. 21 depicts admittance vs frequency curve using the FIG. 4 topology power filter with a shorted failed damper resistor in accordance with one or more embodiments. As shown, the admittance value in the injection frequency range is well above the normal operating value.

Figure 22:
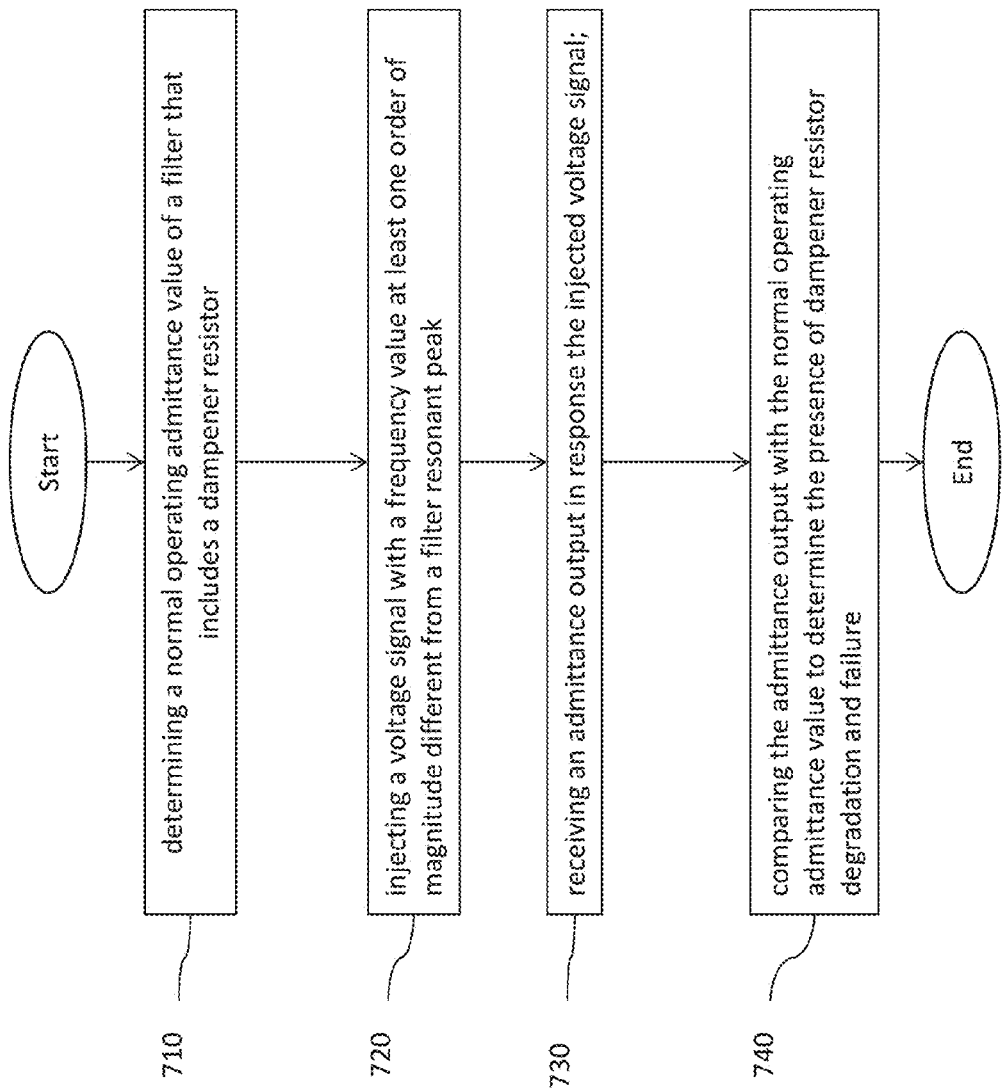
FIG. 22 depicts a flow chart of a method of detecting dampener resistor degradation and/or failure in accordance with one or more embodiments.

FIG. 22 shows a flow chart of a method of detecting dampener resistor degradation and/or failure in accordance with one or more embodiments. The method includes determining a normal operating admittance value of a filter that includes a dampener resistor (operation 710). The method also includes injecting a voltage signal with a frequency value at least one order of magnitude different from a filter resonant peak (operation 720). Further, the method includes receiving an admittance output in response the injected voltage signal (operation 730). Also, the method includes comparing the admittance output with the normal operating admittance value to determine the presence of dampener resistor degradation and failure (operation 740).

According to one or more embodiments, the method includes injecting the voltage signal with a frequency value at least one order of magnitude higher than the filter resonant peak. According to one or more embodiments, the method includes injecting a voltage signal with a frequency value at least one order of magnitude lower than the filter resonant peak. According to one or more embodiments, the method includes measuring the admittance of the filter at the frequency higher than or lower than the resonant peak of filter. According to one or more embodiments, the method includes measuring an impedance of the filter at the frequency higher than or lower than the resonant peak of filter.

According to one or more embodiments, the method includes measuring a conductance of the filter at the frequency higher than or lower than the resonant peak of the filter. According to one or more embodiments, the method includes measuring a resistance of the filter at the frequency higher than or lower than the resonant peak of the filter. According to one or more embodiments, the method includes diagnosing damper conditions based on one or more of a resistance, an impedance, an admittance, and a conductance measurement of the dampener resistor.

According to one or more embodiments, the method includes extracting harmonic signals of frequency higher than or lower than the resonant peak from power supply voltages and currents. According to one or more embodiments, the method includes adapting the method into at least one of a test procedure and a test specification. According to one or more embodiments, the method includes adapting the testing method into a built-in-test code for a product Advantageously, embodiments described herein provide a testing method used to diagnose the conditions of the damper resistors at LRU level that needs access to the input power terminals or connectors only. The testing method can be incorporated into the product level electrical testing or product Power up and BIT testing.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof.

Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of detecting dampener resistor degradation and failure, the method comprising:
   determining a normal operating admittance value of a filter that includes a dampener resistor, the filter being included in a motor controller having an enclosure;
   injecting, at input power terminals outside of enclosure, a voltage signal with a frequency value at least one order of magnitude different from a filter resonant peak of the filter;
   receiving an admittance output at the power terminals in response the injected voltage signal; and
   comparing the admittance output with the normal operating admittance value to determine the presence of dampener resistor degradation and failure.

2. The method of claim 1, wherein injecting the voltage signal with the frequency value at least one order of magnitude different from a filter resonant peak further comprises:
   injecting the voltage signal with a frequency value at least one order of magnitude higher than the filter resonant peak.

3. The method of claim 1, wherein injecting the voltage signal with the frequency value at least one order of magnitude different from a filter resonant peak further comprises:
   injecting a voltage signal with a frequency value at least one order of magnitude lower than the filter resonant peak.

4. The method of claim 1, further comprising:
   measuring the admittance of the filter at the frequency higher than or lower than the resonant peak of the filter.

5. The method of claim 1, further comprising:
   measuring an impedance of the filter at the frequency higher than or lower than the resonant peak of the filter.

6. The method of claim 1, further comprising:
   measuring a conductance of the filter at the frequency higher than or lower than the resonant peak of the filter.

7. The method of claim 1, further comprising:
   measuring a resistance of the filter at the frequency higher than or lower than the resonant peak of the filter.

8. The method of claim 1, further comprising:
   diagnosing damper conditions based on one or more of a resistance, an impedance, an admittance, and a conductance measurement of the dampener resistor.

9. The method of claim 8, wherein diagnosing damper conditions further comprising:
   extracting harmonic signals of frequency higher than or lower than the resonant peak from power supply voltages and currents.

10. The method of claim 1, further comprising:
    adapting the method into at least one of a test procedure and a test specification.

11. The method of claim 1, further comprising:
    adapting the testing method into a built-in-test code for a product.

12. A system for detecting dampener resistor degradation and failure, the system comprising:
    a memory having computer readable instructions; and
    a processor configured to execute the computer readable instructions, the computer readable instructions comprising:
       determining a normal operating admittance value of a filter that includes a dampener resistor, the filter being included in a motor controller having an enclosure;
       injecting, at input power terminals outside of enclosure, a voltage signal with a frequency value at least one order of magnitude different from a filter resonant peak of the filter;
       receiving an admittance output at the power terminals in response the injected voltage signal; and
       comparing the admittance output with the normal operating admittance value to determine the presence of dampener resistor degradation and failure.

13. The system of claim 12, further comprising additional computer readable instructions, the computer readable instructions comprising:

injecting the voltage signal with a frequency value at least one order of magnitude higher than the filter resonant peak.

14. The system of claim 12, further comprising additional computer readable instructions, the computer readable instructions comprising:

injecting a voltage signal with a frequency value at least one order of magnitude lower than the filter resonant peak.

15. The system of claim 12, further comprising additional computer readable instructions, the computer readable instructions comprising:

measuring the admittance of the filter at the frequency higher than or lower than the resonant peak of the filter.

16. The system of claim 12, further comprising additional computer readable instructions, the computer readable instructions comprising:

measuring an impedance of the filter at the frequency higher than or lower than the resonant peak of the filter.

17. The system of claim 12, further comprising additional computer readable instructions, the computer readable instructions comprising:

measuring a conductance of the filter at the frequency higher than or lower than the resonant peak of the filter.

18. The system of claim 12, further comprising additional computer readable instructions, the computer readable instructions comprising:

measuring a resistance of the filter at the frequency higher than or lower than the resonant peak of the filter.

19. The system of claim 12, further comprising additional computer readable instructions, the computer readable instructions comprising:

diagnosing damper conditions based on one or more of a resistance, an impedance, an admittance, and a conductance measurement of the dampener resistor.

20. A non-transitory computer program product for detecting dampener resistor degradation and failure, the computer program product comprising a computer readable storage medium having program instructions embodied therewith, the program instructions executable by a processor to cause the processor to:

determine a normal operating admittance value of a filter that includes a dampener resistor, the filter being included in a motor controller having an enclosure and input power terminals;

inject, at the input power terminals and outside of enclosure, a voltage signal with a frequency value at least one order of magnitude different from a filter resonant peak of the filter;

receive an admittance output at the power terminals in response the injected voltage signal; and compare the admittance output with the normal operating admittance value to determine the presence of dampener resistor degradation and failure.

* * * * *